US006622334B1

(12) United States Patent
Ziemins et al.

(10) Patent No.: US 6,622,334 B1
(45) Date of Patent: Sep. 23, 2003

(54) WAFER EDGE CLEANING UTILIZING POLISH PAD MATERIAL

(75) Inventors: Uldis A. Ziemins, Poughkeepsie, NY (US); Donald J. Delehanty, Wappingers Falls, NY (US); Raymond M. Khoury, Wappingers Falls, NY (US); Jose M. Ocasio, Maybrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/537,206

(22) Filed: Mar. 29, 2000

(51) Int. Cl.[7] .................. B01B 11/02; A46B 13/04
(52) U.S. Cl. ................ 15/77; 15/97.1; 15/88.3; 15/88.2
(58) Field of Search ............... 15/77, 89.2, 89.3, 15/97.1, 102; 451/44, 41

(56) References Cited

U.S. PATENT DOCUMENTS

| 5,128,281 | A | | 7/1992 | Dyer et al. |
| 5,424,224 | A | | 6/1995 | Allen et al. |
| 5,894,622 | A | * | 4/1999 | Manfredi et al. .............. 15/102 |
| 6,012,192 | A | * | 1/2000 | Sawada et al. ................. 15/77 |
| 6,055,694 | A | * | 5/2000 | Steere .......................... 15/21.1 |
| 6,167,583 | B1 | * | 1/2001 | Miyashita et al. ........... 134/172 |
| 6,254,688 | B1 | * | 7/2001 | Kobayashi et al. ............ 134/1 |
| 6,290,780 | B1 | * | 9/2001 | Ravkin ........................... 134/6 |
| 6,334,229 | B1 | * | 1/2002 | Moinpour et al. .............. 15/77 |

* cited by examiner

Primary Examiner—Robert J. Warden, Sr.
Assistant Examiner—Shay Balsis
(74) Attorney, Agent, or Firm—Wood, Phillips, Katz, Clark & Mortimer

(57) ABSTRACT

An improvement is disclosed in a brush cleaning apparatus for cleaning a major surface of a wafer and including wafer guide wheels for transporting the wafer. The improvement includes a polish pad material disposed on a circumference of the guide wheels. The polish pad material is a material used in chemical-mechanical polishing of the wafer. The polish pad material contacts an edge portion of the wafer during cleaning thereof, thereby removing contaminants from the edge portion of the wafer, so that edge cleaning is performed in situ in addition to the brush cleaning of the major surface of the wafer.

8 Claims, 5 Drawing Sheets

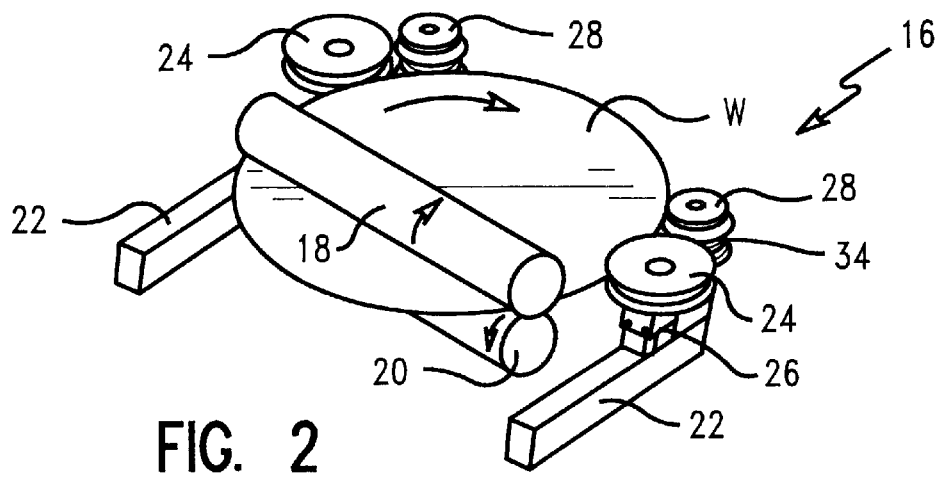
FIG. 2
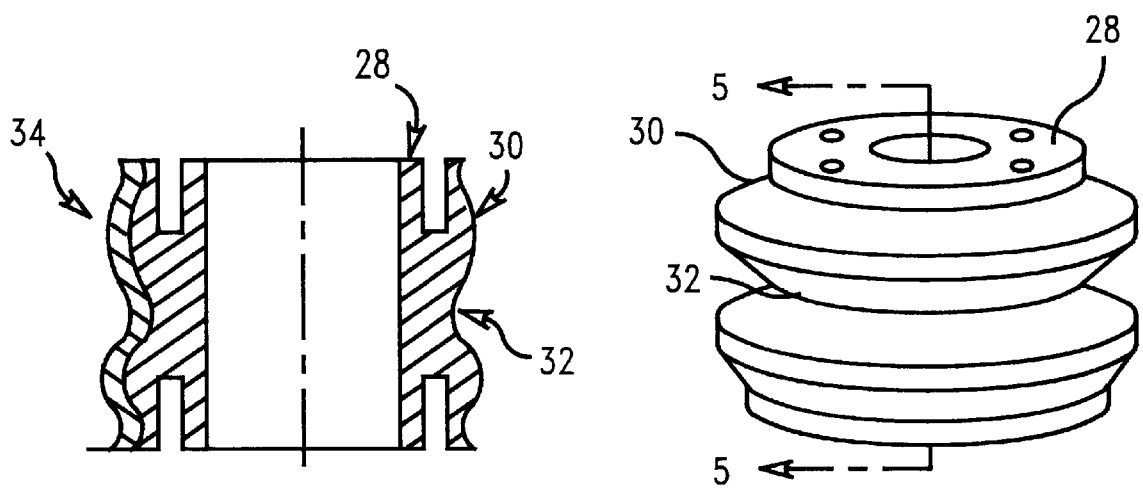
FIG. 5
FIG. 4
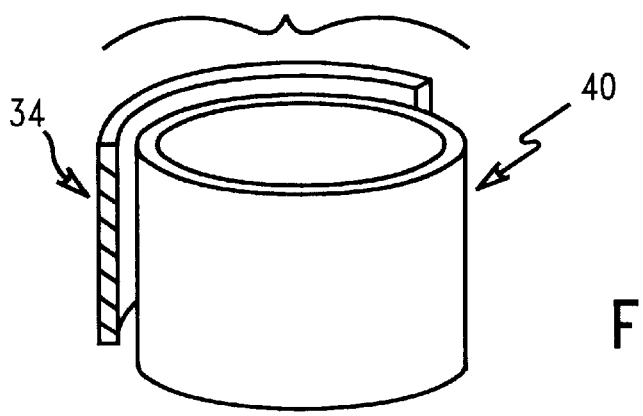
FIG. 6

WAFER EDGE CLEANING UTILIZING POLISH PAD MATERIAL

FIELD OF THE INVENTION

This invention relates to cleaning of semiconductor wafers and, more particularly, to an apparatus and method for wafer edge cleaning using a polish pad material such as is used in a chemical-mechanical polishing apparatus.

BACKGROUND OF THE INVENTION

Chemical-mechanical polishing (CMP) is performed in the processing of semiconductor wafers and/or chips on commercially available polishing apparatus. The standard CMP polishing apparatus has a circular polishing pad and a rotating carrier for holding the wafer. A slurry is used on the polishing pad.

The semiconductor wafer undergoes a cleaning process subsequent to the CMP process. The cleaning process is necessary to prevent redeposition of foreign matter on the wafer and subsequent process operations, which inflicts yield detractors and loss of chips per wafer.

One conventional cleaning process comprises a brush cleaner. The semiconductor wafer is rotated by drive wheels while two brushes, or sets of brushes, one on the top and one on the bottom, clean the top and bottom surfaces. Some processes use a cleaning additive. Nevertheless, with such cleaning processes the outside perimeter of the wafer can hold some of the slurry and other foreign matter. These contaminants can later harden and crumble back on to the wafer resulting in the contaminants being redeposited.

The present invention is directed to solving one or more of the problems discussed above, in a novel and simple manner.

SUMMARY OF THE INVENTION

In accordance with the invention there is provided a method and apparatus for cleaning the edge of a wafer implemented in a wafer cleaning apparatus for cleaning a major surface of the wafer.

Broadly, there is disclosed herein a method for cleaning an edge of a wafer, the method being performed after a process employing a slurry on the wafer. The method comprises the steps of transporting the wafer using wafer drive wheels for rotating the wafer. The edge of the wafer is contacted with a polish pad material. The polish pad material is a material used in chemical-mechanical polishing of the wafer. The transporting and the contacting are performed in a wafer cleaning apparatus for cleaning a major surface of the wafer.

It is a feature of the invention that the contacting step comprises contacting the edge of the wafer with a guide wheel having the polish pad material on a circumference thereof.

The guide wheel is contoured having a circumferential groove receiving the edge of the wafer.

In accordance with another aspect of the invention an inflatable air bladder is disposed inwardly of the polish pad material to contour the polish pad material to the edge of the wafer.

It is another feature of the invention that the guide wheel is rotated in a direction opposite rotation of the wafer.

In accordance with another aspect of the invention, a dilute hydrofluoric acid is applied to the edge of the wafer. The dilute hydrofluoric acid is applied with a roll applicator.

In accordance with yet another aspect of the invention the edge of the wafer is selectively contacted with a brush. The brush comprises a rotating cup brush.

There is disclosed in accordance with another aspect of the invention an improvement in a brush cleaning apparatus for cleaning a major surface of a wafer and including wafer guide wheels for transporting the wafer. The improvement includes a polish pad material disposed on a circumference of the guide wheels. The polish pad material is a material used in chemical-mechanical polishing of the wafer. The polish pad material contacts an edge portion of the wafer during cleaning thereof, thereby removing contaminants from the edge portion of the wafer, so that edge cleaning is performed in situ in addition to the brush cleaning of the major surface of the wafer.

Further features and advantages of the invention will be readily apparent from the specification and from the drawings.

BRIEF DESCRIPTION OF THE DRAWINGS

FIG. 2 is a partial perspective view illustrating a first embodiment of the wafer cleaning apparatus of FIG. 1.

FIG. 4 is a perspective view of a guide wheel used in the cleaning apparatus of FIG. 2;

FIG. 5 is a sectional view taken along the line 5—5 of FIG. 4 and including the polish pad material;

FIG. 6 is a perspective, partial sectional exploded view of a an air bladder used with the guide wheel of FIG. 4 according to an alternative embodiment of the invention;

DETAILED DESCRIPTION OF THE INVENTION

Figure 1:
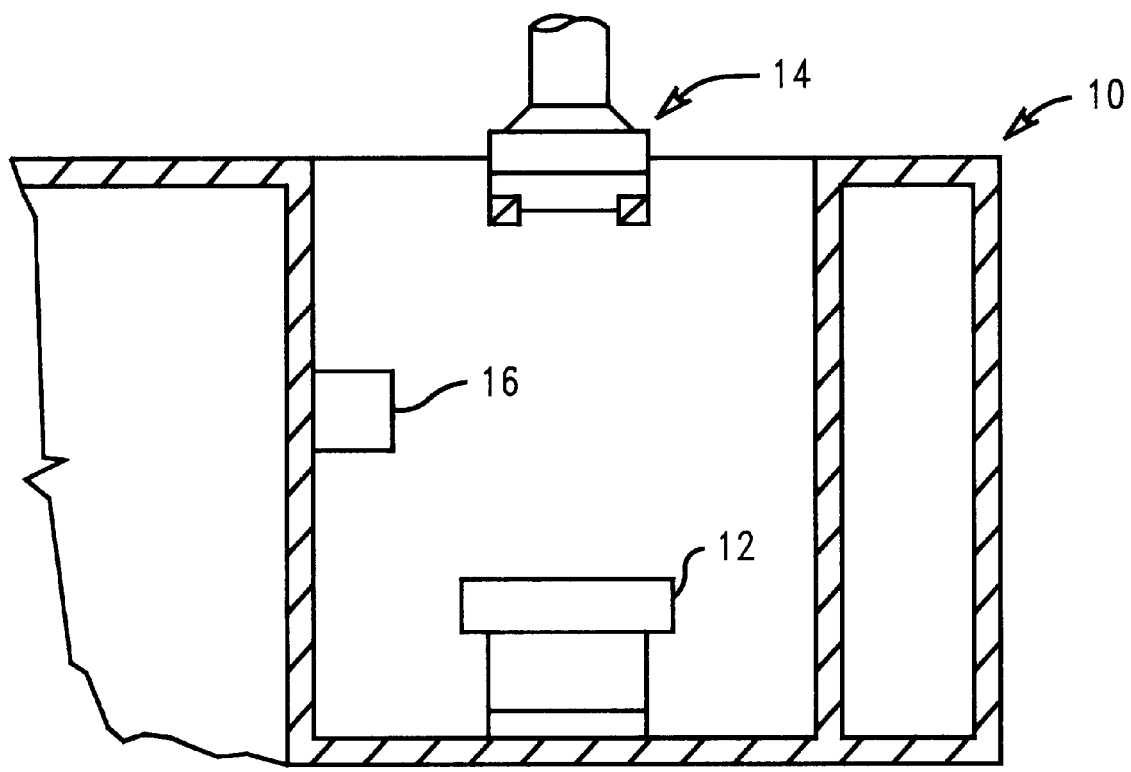
FIG. 1 is a partial sectional view illustrating a chemical-mechanical polishing apparatus including a wafer cleaning apparatus in accordance with the invention.

Referring initially to FIG. 1, a chemical-mechanical polishing (CMP) apparatus 10 is illustrated. The CMP apparatus 10 is generally of conventional overall construction and includes a circular polishing table 12 and a rotating carrier 14. The carrier 14 is adapted to support a workpiece in the form a semiconductor wafer.

A wafer cleaning apparatus is illustrated generally at 16 as an integral component of the CMP apparatus 10. The cleaning apparatus 16 utilizes a method for cleaning an edge of a wafer in accordance with the invention. While the cleaning apparatus 16 is illustrated as an integral component of the CMP apparatus 10, the cleaning apparatus 16 may be a separate component.

Figure 3:
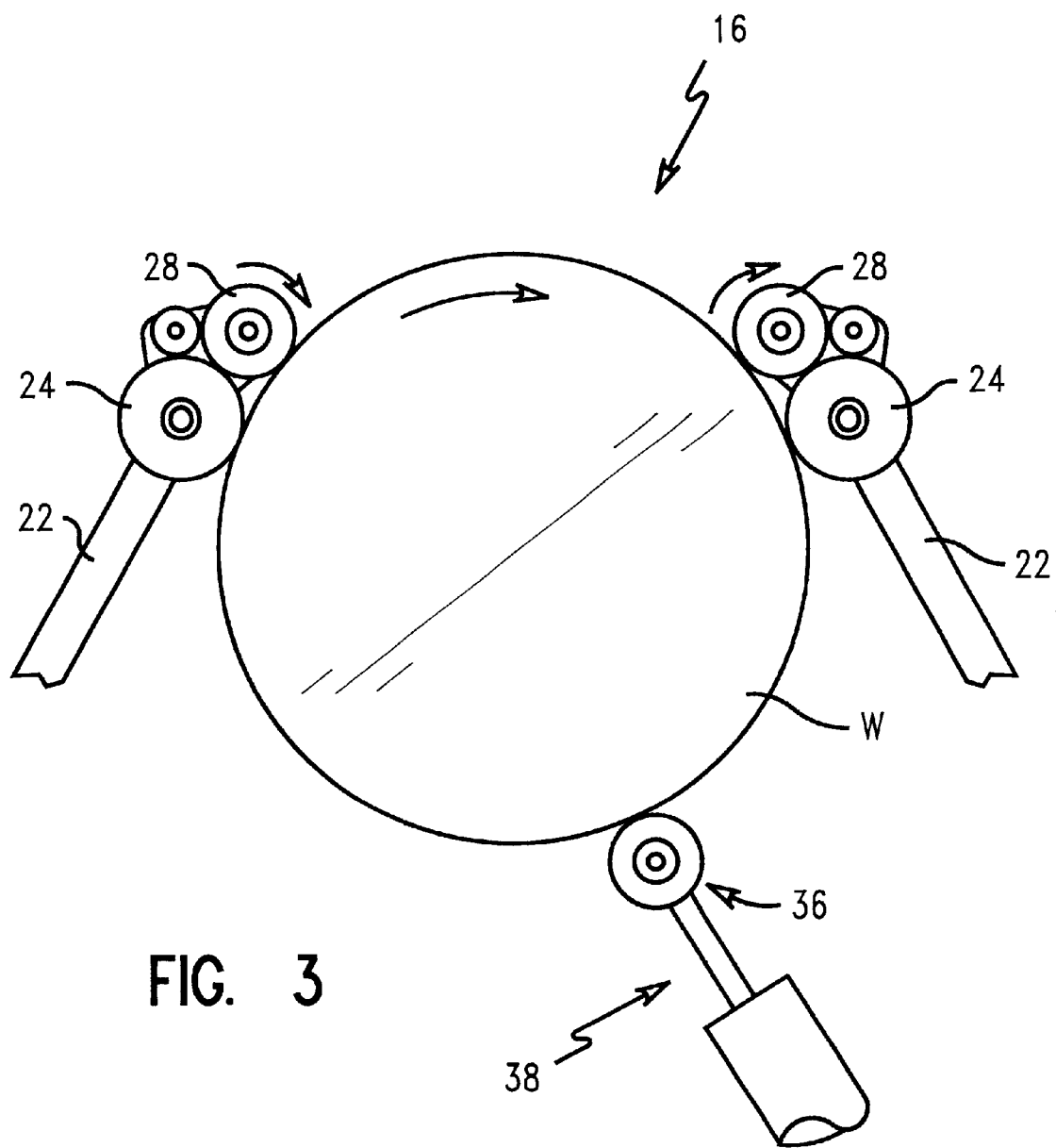
FIG. 3 is a top plan view of the wafer cleaning apparatus of FIG. 2, with surface brush cleaners removed for clarity, and further illustrating an additional edge cleaning apparatus in accordance with the invention.

Referring to FIGS. 2 and 3, the cleaning apparatus 16 is illustrated in greater detail. The cleaning apparatus 16 comprises an improvement in a conventional brush cleaning apparatus such as, for example, an ONTRAK® brush cleaner Series DSS-200.

The conventional brush cleaning apparatus is adapted to clean both major surfaces of the wafer W, namely the upper surface and lower surface, A conveyor mechanism (not shown), moves the wafer W into position between an upper brush 18 and a lower brush 20. Pneumatic control arms 22 are moveable into and out of position relative to the wafer W. The pneumatic control arms 22 support drive wheels 24 having motors 26 for rotating the wafer 20 in a direction indicated by the arrow. The brushes 18 and 20 are also rotated by motors (not shown) to provide surface cleaning of the wafer W.

As discussed above in the background, the wafer cleaning apparatus 16 is used subsequent to CMP polishing of the wafer W. The brushes 18 and 20 clean the major surfaces of the wafer 20 to remove the slurry and other foreign matter to minimize contaminants which can affect further processing of the wafer W. The control arms 22 also support guide wheels 28. In accordance with the invention, the guide wheels contact an edge portion of the wafer W with a polish pad material during cleaning thereof so that edge cleaning is performed in situ in addition to the brush cleaning of the major surfaces of the wafer W.

Referring to FIG. 4, the guide wheel 28 is illustrated. The guide wheel 28 is in the form of a spool or bobbin and includes a contoured circumferential surface 30 including a central groove 32. In accordance with the invention, a polish pad material 34 (see FIG. 5), is disposed on the circumferential surface 30 of the guide wheel 28. The polish pad material 34 is a type of material used in the CMP apparatus 10 for polishing the wafer W. The polish pad material may be, for example, Rodel Politex pad.

The edge of the wafer W is in contact with the polish pad 34, particularly at the groove 32. The guide wheels 28 are rotated in a direction, indicated by arrows in FIG. 3, opposite rotation of the wafer W. The pneumatic arms 22 may be controlled to provide a slight force, less than two (2) pounds, at the edge of the wafer W. The guide wheels 28 may be rotated by a variable speed motor to be operated at 25 to 75 rpm.

Although in the illustrated embodiment of the invention, separate drive wheels 24 and guide wheels 28 are used, the polish pad material could alternatively be provided in the drive wheels 24, as will be apparent.

In accordance with the invention, a third guide wheel 36, see FIG. 3, can be provided at an additional location relative to the wafer W. The guide wheel 36 is moved into and out of position using a pneumatic cylinder 38 or other transport means to shuttle the wheel 36 into and out of position relative to the edge of the wafer W. The guide wheel 36 is similar to the guide wheel 28, see FIG. 5, and is covered with the polish pad material 34.

Referring to FIG. 6, an inflatable air bladder 40 may be slipped over the guide wheel 28 of FIG. 4 and then wrapped with the polish pad material 34. The air bladder 40 is inflated with a low air pressure to act as a contouring device to wrap around the wafer's edge and provide uniform contact for the polish pad material 34. The polish pad material 34 is wrapped around the inflated air bladder 40 and allows the wafer to have a uniform edge contact when the assembly is shuttled into position. The bladder 40 provides compliance and enables the polish pad 34 to effectively contact the complete wafer's edge.

Figure 7:
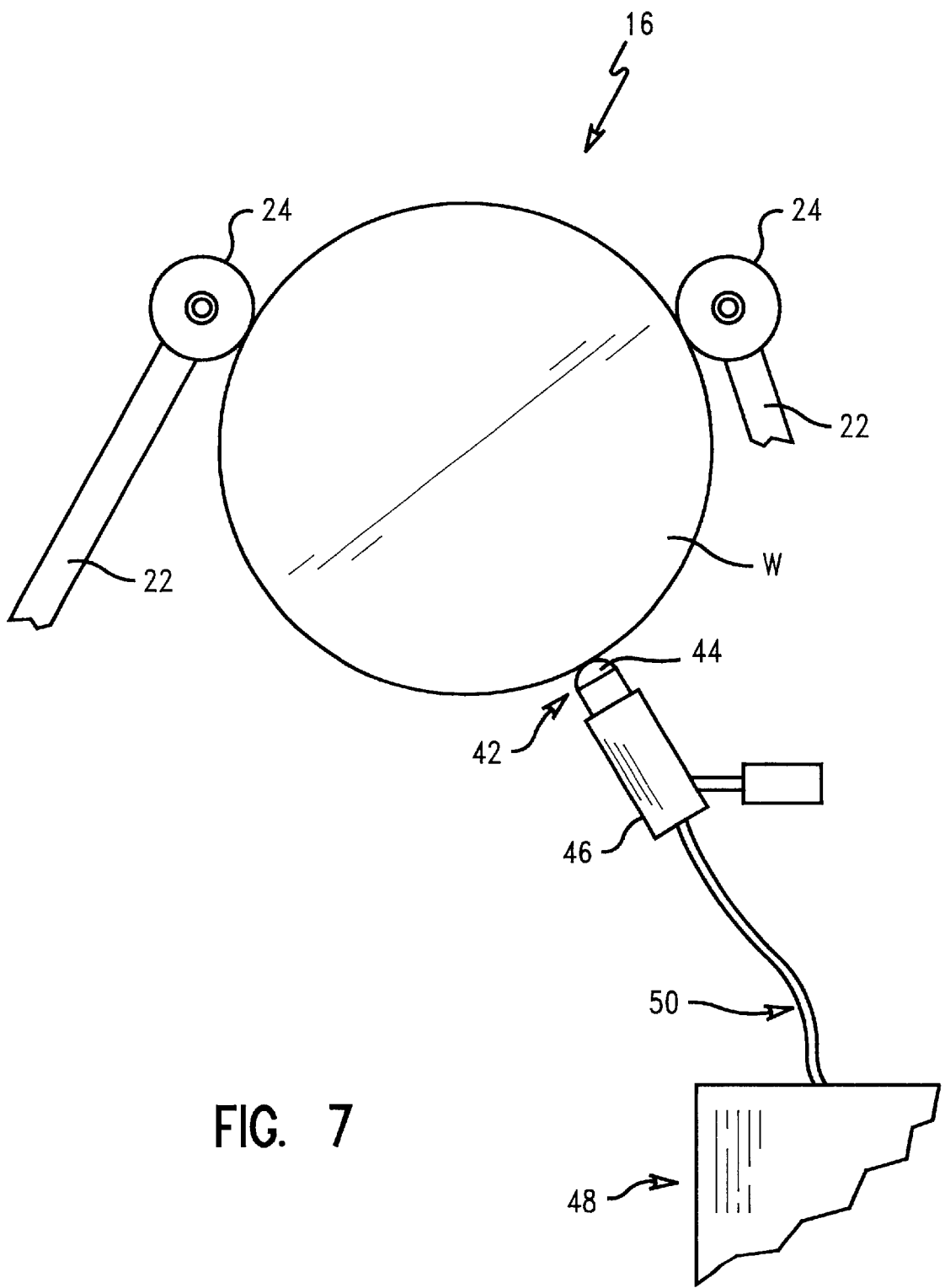
FIG. 7 is a top plan view, similar to FIG. 3, illustrating an alternative embodiment of an apparatus for cleaning an edge of a wafer in accordance with the invention.

Referring to FIG. 7, a cleaning apparatus 16' in accordance with a second embodiment of the invention is illustrated. The cleaning apparatus 16' includes the control arms 22 and drive wheels 24, similar to the embodiment of FIG. 2. An applicator 42 is positioned to contact an edge of the wafer W. In the illustrated embodiment of the invention, the applicator 42 comprises a roll applicator, such as a deodorant roll applicator, where a contact ball 44 spins with rotation of the wafer W. The ball is housed in a cylindrical housing 46 which stores a supply of a cleaner. The cleaner is applied to the edge of the wafer W in contact with the ball 44, as is known. The cleaner may comprise, for example, dilute hydrofluoric acid (DHF).

The applicator 42 allows a small volume of DHF to be applied to the area to be cleaned, namely the edge of the wafer W. Alternately, the DHF applicator 42 may be of a sponge type where the contact is provided by a polyvinyl alcohol (PVA) sponge or other compatible sponge material that allows a small amount of the DHF to be dispensed as the wafer W rotates and contacts the sponge.

A dispensing system includes a reservoir 48 under pressure to supply the cleaning fluid to the housing 46 via tubing 50. Other items such as check valves, safety valves, pressure gauges, alarms and other devices may also be used. Alternatively, the DHF could be supplied to the applicator 42 using a metered pump or other device standard to the industry. The system dispenses a 10:1 up to 100:1 premixed DUF solution to the applicator 42 to provide minimal cleaner to the edge of the wafer W. The DHF dissolves the slurry contaminant on the edge of the wafer W without harming the wafer devices or other surface structures. Various dispense volumes will be required dependent upon the type of wafer and slurry contamination on the edge.

While the roll applicator 42 is illustrated independent of the cleaning apparatus of FIG. 2, the roll applicator 42 could be used in conjunction with the guide wheels 28 having the polish pad material 34.

Figure 9:
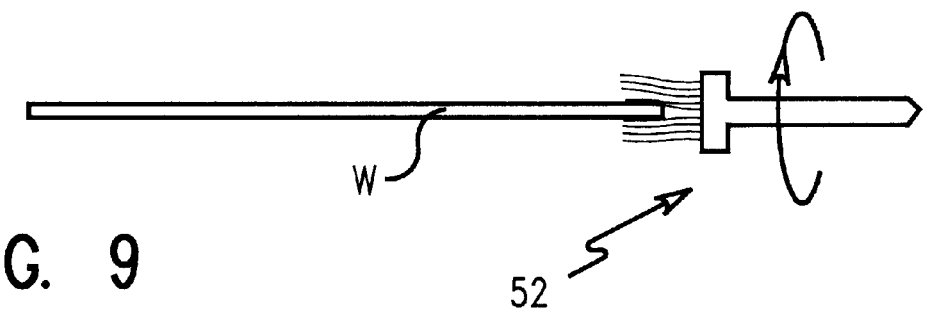
FIG. 9 is a partial side view illustrating the wafer edge cleaning of FIG. 8.
Figure 8:
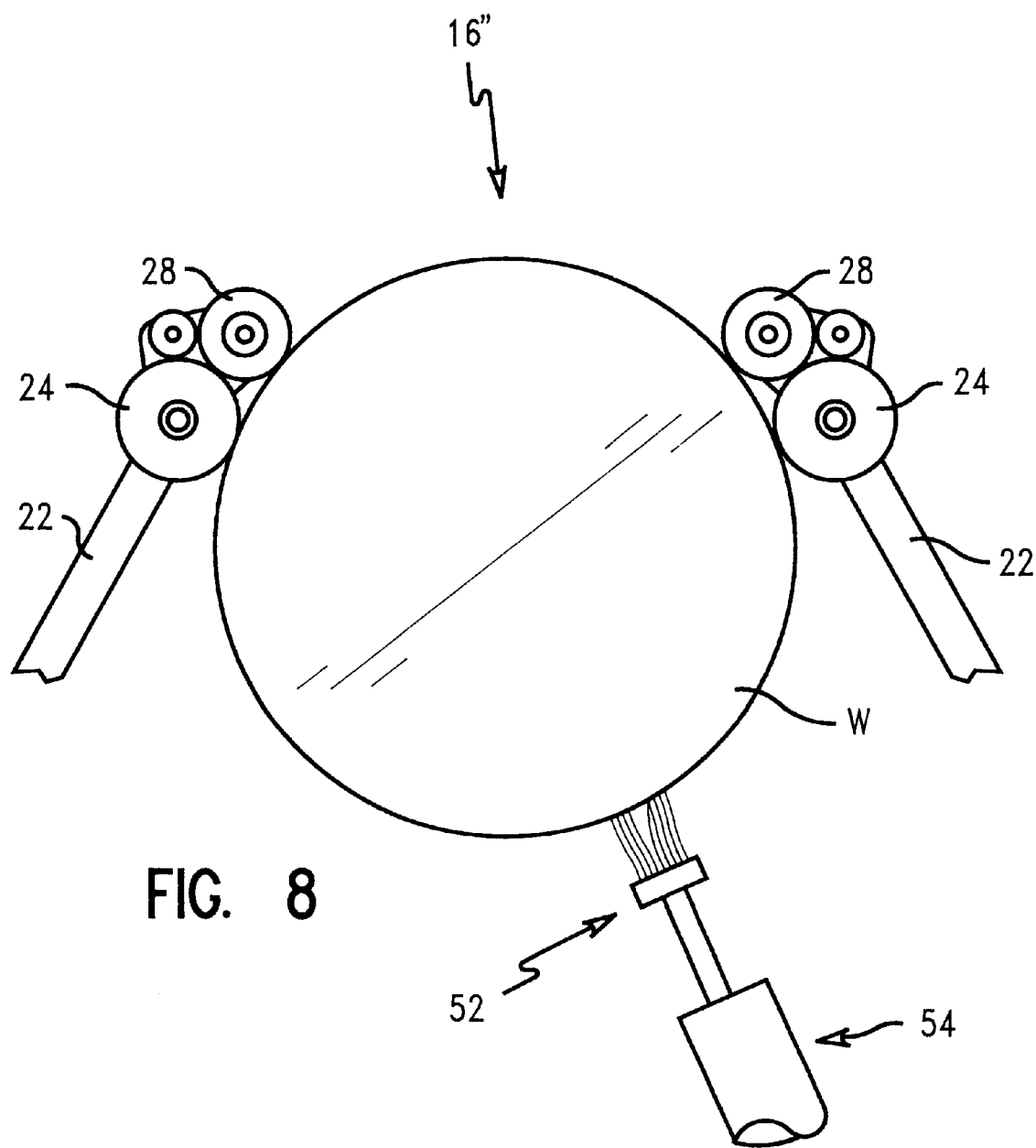
FIG. 8 is top plan view, similar to FIG. 3, illustrating yet another embodiment of an apparatus for cleaning an edge of a wafer in accordance with the invention.

Referring to FIG. 8, a cleaning apparatus 16" in accordance with a third embodiment of the invention is illustrated. This embodiment includes the control arms 22, drive wheels 24 and guide wheels 28 as in FIG. 3. Additionally, a brush cleaner 52 can be shuttled into and out of position relative to an edge of the wafer W using a pneumatic cylinder 54 or the like. The brush 52 can be of cup shape made of nylon or other non-scratching material to silicon. The brush 52 can also be a standard straight bristle type brush or any other configuration. Likewise, the brush may be an ultrasonic type or rotary type which provides additional cleaning action to the wafer's edge. In the illustrated embodiment of the invention, the brush 52 comprises a cup brush and a rotary motion is used, as illustrated in FIG. 9, to remove contaminants from the wafer's edge. A rotary speed of up to 100 rpm may be applied. The rotary motion can be supplied by a DC motor via a drive cable or other means known in the art. The brush 52 may spin clockwise or counterclockwise to aid or detract in the rotation of the wafer W, driven by the drive wheels 24. The brush orientation relative to the wafer W is shown in FIG. 9. The brush 52 is only brought into minimal contact with the wafer W or within the first required depth which is not cleaned by any other means or processes. The objective of the brush 52 is to eliminate contaminants from the edge, rather than the major surfaces of the wafer W.

While the brush cleaner 52 is illustrated in conjunction with the guide wheels 28 using a polish pad material 34, the brush 52 could be used as part of a stand-alone cleaning system.

Various other apparatus may be used in conjunction with the three embodiments discussed above to aid in removal of contaminants. These may consist of water jets, air or gas jets, ultrasonic cleaning or the like.

The three embodiments discussed above are implemented in situ with a brush cleaner but may also be used in standalone systems. Likewise, the cleaning apparatus can be configured into the CMP apparatus 10 as illustrated in FIG. 1.

We claim:

1. In a brush cleaning apparatus for cleaning a major surface of a wafer and including wafer drive wheels for rotating the wafer, the improvement comprising:

wafer guide wheels supported proximate the wafer, with a polish pad material disposed on a circumference of the guide wheels, wherein the guide wheel is rotated in a direction opposite rotation of the wafer at the point of contact, and wherein the polish pad material contacts an edge portion of the wafer during cleaning thereof, thereby removing contaminants from the edge portion of the wafer, so that edge cleaning is performed in situ in addition to the brush cleaning of the major surface of the wafer, and wherein each drive wheel is supported on a control arm and each control arm also supports one of the guide wheels.

2. The improvement of claim 1 wherein the guide wheel is contoured having a circumferential groove receiving the edge of the wafer.

3. The improvement of claim 1 further comprising an inflatable air bladder disposed inwardly of the polish pad material to contour the polish pad material to the edge of the wafer.

4. The improvement of claim 1 further comprising an applicator applying dilute hydrofluoric acid to the edge of the wafer.

5. The improvement of claim 4 wherein the applicator comprises a roll applicator.

6. The improvement of claim 1 further comprising a brush contacting the edge of the wafer.

7. The improvement of claim 6 wherein the brush comprises a rotating cup brush.

8. The improvement of claim 6 further comprising a cylinder for moving the brush into and out of contact with the edge of the wafer.

* * * * *